(12) United States Patent  (10) Patent No.: US 7,547,579 B1
Jiang  (45) Date of Patent: Jun. 16, 2009

(54) UNDERFILL PROCESS

(75) Inventor: Tongbi Jiang, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 740 days.

(21) Appl. No.: 09/544,822

(22) Filed: Apr. 6, 2000

(51) Int. Cl.
*H01L 21/00* (2006.01)

(52) U.S. Cl. ............... 438/118; 438/119; 438/406; 438/455; 438/456; 438/457; 438/458; 438/459; 438/615; 438/616; 438/617

(58) Field of Classification Search ............... 438/106, 438/125, 108, 118
See application file for complete search history.

(56) References Cited

U.S. PATENT DOCUMENTS

| | | | | |
|---|---|---|---|---|
| 3,079,361 A | * | 2/1963 | Plueddemann | 523/214 |
| 3,619,246 A | * | 11/1971 | Bragole | 428/422 |
| 3,854,793 A | * | 12/1974 | Kahn | 349/128 |
| 3,869,787 A | * | 3/1975 | Umbaugh | |
| 4,231,910 A | * | 11/1980 | Plueddemann | 156/329 |
| 4,238,528 A | * | 12/1980 | Angelo et al. | 228/214 |
| 4,388,132 A | * | 6/1983 | Hoge et al. | 156/153 |
| 4,689,085 A | * | 8/1987 | Plueddemann | 106/287.14 |
| 4,690,959 A | * | 9/1987 | Plueddemann | 523/213 |
| 4,718,944 A | * | 1/1988 | Plueddemann | 106/287.11 |
| 4,719,262 A | * | 1/1988 | Plueddemann | 525/105 |
| 4,786,528 A | * | 11/1988 | Amelio et al. | 427/289 |
| 4,800,125 A | * | 1/1989 | Plueddemann | 428/405 |
| 4,849,294 A | * | 7/1989 | Plueddemann | 428/451 |
| 4,863,978 A | * | 9/1989 | Plueddemann | 523/213 |
| 4,871,788 A | * | 10/1989 | Plueddemann | 523/213 |
| 4,961,967 A | * | 10/1990 | Pluddemann | 427/302 |
| 5,001,011 A | * | 3/1991 | Plueddemann | 428/447 |
| 5,002,831 A | * | 3/1991 | Plueddemann | 428/447 |
| 5,006,573 A | * | 4/1991 | Plueddemann | 523/214 |
| 5,041,593 A | * | 8/1991 | Plueddemann | 556/440 |
| 5,053,048 A | * | 10/1991 | Pinchuk | 623/1.43 |
| 5,078,475 A | * | 1/1992 | Sekimura et al. | 349/138 |
| 5,089,300 A | * | 2/1992 | Plueddemann | 427/299 |
| 5,203,076 A | * | 4/1993 | Banerji et al. | |
| 5,212,402 A | * | 5/1993 | Higgins, III | 257/532 |
| 5,218,234 A | | 6/1993 | Thompson et al. | |
| 5,239,447 A | | 8/1993 | Cotues et al. | |
| 5,258,648 A | | 11/1993 | Lin | |
| 5,311,059 A | | 5/1994 | Banerji et al. | |
| RE34,675 E | * | 7/1994 | Plueddemann | 106/287.1 |
| 5,371,404 A | | 12/1994 | Juskey et al. | |
| 5,385,869 A | | 1/1995 | Lin et al. | |
| 5,410,181 A | | 4/1995 | Zollo et al. | |

(Continued)

OTHER PUBLICATIONS

Surface Tension. http://hyperphysics.phy-astr.gsu.edu/hbase/surten2.html [Jul. 30, 2002].*

*Primary Examiner*—David E Graybill
(74) *Attorney, Agent, or Firm*—TraskBritt

(57) ABSTRACT

A method and apparatus for underfilling a gap between a semiconductor die or device and a substrate, where the semiconductor die or device is electrically connected to the substrate so that an active surface of the semiconductor die is facing a top surface of the substrate with the gap therebetween. A silane layer is applied to the active surface of the semiconductor die, the upper surface of the substrate, and/or both to increase the surface tension thereon. The increased surface tension thereby allows the underfill material to fill the gap via capillary action in a lesser flow time more effectively, and therefore, is more efficient than conventional underfilling methods.

38 Claims, 7 Drawing Sheets

U.S. PATENT DOCUMENTS

| | | | |
|---|---|---|---|
| 5,438,219 A | 8/1995 | Kotzan et al. | |
| 5,439,162 A | 8/1995 | George et al. | |
| 5,442,240 A | 8/1995 | Mukerji | |
| 5,450,283 A | 9/1995 | Lin et al. | |
| 5,468,995 A | 11/1995 | Higgins, III | |
| 5,492,863 A * | 2/1996 | Higgins, III | 438/610 |
| 5,498,576 A | 3/1996 | Hotchkiss et al. | |
| 5,532,187 A | 7/1996 | Schreiber-Prillwitz et al. | |
| 5,552,638 A * | 9/1996 | O'Connor et al. | 257/759 |
| 5,639,555 A * | 6/1997 | Bishop | 428/447 |
| 5,651,179 A | 7/1997 | Bessho et al. | |
| 5,710,071 A | 1/1998 | Beddingfield et al. | |
| 5,736,251 A * | 4/1998 | Pinchuk | 428/447 |
| 5,766,982 A * | 6/1998 | Akram et al. | |
| 5,783,867 A * | 7/1998 | Belke et al. | 257/783 |
| 5,855,821 A * | 1/1999 | Chau et al. | 252/512 |
| 5,863,970 A * | 1/1999 | Ghoshal et al. | 523/427 |
| 5,864,178 A | 1/1999 | Yamada et al. | |
| 5,897,914 A * | 4/1999 | DePriest | 427/137 |
| 5,928,791 A * | 7/1999 | Rosenmayer | 428/421 |
| 5,959,363 A * | 9/1999 | Yamada et al. | 257/787 |
| 5,960,258 A | 9/1999 | Moden | |
| 5,972,739 A * | 10/1999 | Funada et al. | 438/127 |
| 5,973,404 A | 10/1999 | Akram et al. | |
| 5,975,408 A | 11/1999 | Goossen | |
| 5,981,312 A | 11/1999 | Farquhar et al. | |
| 5,998,242 A | 12/1999 | Kirkpatrick et al. | |
| 6,000,924 A | 12/1999 | Wang et al. | |
| 6,002,171 A | 12/1999 | Desai et al. | |
| 6,054,769 A * | 4/2000 | Jeng | 257/758 |
| 6,057,381 A * | 5/2000 | Ma et al. | 522/99 |
| 6,063,828 A * | 5/2000 | Ma et al. | 522/96 |
| 6,074,895 A * | 6/2000 | Dery et al. | 438/108 |
| 6,103,549 A * | 8/2000 | Master et al. | |
| 6,108,210 A * | 8/2000 | Chung | 361/747 |
| 6,121,689 A * | 9/2000 | Capote et al. | 257/783 |
| 6,165,386 A * | 12/2000 | Endo et al. | 252/500 |
| 6,180,187 B1 * | 1/2001 | Ma et al. | 427/513 |
| 6,180,696 B1 * | 1/2001 | Wong et al. | 523/456 |
| 6,187,374 B1 * | 2/2001 | Hardy et al. | 427/140 |
| 6,190,940 B1 | 2/2001 | DeFelice et al. | |
| 6,194,788 B1 * | 2/2001 | Gilleo et al. | 257/789 |
| 6,201,192 B1 * | 3/2001 | Wille et al. | 174/255 |
| 6,221,998 B1 * | 4/2001 | Okuhira et al. | 528/28 |
| 6,228,678 B1 * | 5/2001 | Gilleo et al. | 438/108 |
| 6,228,681 B1 * | 5/2001 | Gilleo et al. | 438/108 |
| 6,238,223 B1 * | 5/2001 | Cobbley et al. | 439/119 |
| 6,248,614 B1 * | 6/2001 | Kodnani et al. | |
| 6,251,766 B1 * | 6/2001 | Desai et al. | |
| 6,261,638 B1 * | 7/2001 | van Ooij et al. | 427/379 |
| 6,265,776 B1 * | 7/2001 | Gilleo | 257/738 |
| 6,281,567 B1 * | 8/2001 | Murayama et al. | 257/676 |
| 6,303,277 B1 * | 10/2001 | Hieda et al. | 430/322 |
| 6,333,206 B1 * | 12/2001 | Ito et al. | 257/686 |
| 6,350,840 B1 * | 2/2002 | Schultz et al. | 526/305 |
| 6,367,150 B1 * | 4/2002 | Kirsten | 156/182 |
| 6,404,643 B1 * | 6/2002 | Chung | 361/737 |
| 6,410,415 B1 | 6/2002 | Estes et al. | |
| 6,416,869 B1 * | 7/2002 | van Ooij et al. | 428/450 |
| 6,620,719 B1 * | 9/2003 | Andry et al. | 438/597 |
| 6,827,981 B2 * | 12/2004 | van Ooij et al. | 427/387 |
| 2002/0084277 A1 * | 7/2002 | Mullens et al. | 220/560.04 |

\* cited by examiner

UNDERFILL PROCESS

BACKGROUND OF THE INVENTION

1. Field of the Invention

The present invention relates to semiconductor die or semiconductor devices mounted on substrates. More specifically, the present invention relates to a method and apparatus for underfilling the gap between a bumped or raised semiconductor die or semiconductor device and a substrate.

2. State of the Art

Semiconductor die and bumped die technology is well known in the art. A semiconductor die or bumped (raised) die includes a bare or unpackaged semiconductor die having bumps on the bond pads formed on the active surface or front side thereof. The bumps located on the bond pads of the semiconductor die are used as both electrical connectors and mechanical connectors to attach the semiconductor die to a substrate. The semiconductor die is flipped and bonded to a substrate via the bumps located on the bond pads of the semiconductor die. Several materials are typically used to form the bumps on the semiconductor die, such as solder, conductive polymers, etc. Typically, if the bumps located on the bond pads of the semiconductor die are solder bumps, the solder bumps are reflowed to form a solder joint between the semiconductor die and the substrate, the solder joint forming both electrical and mechanical connections between the semiconductor die and the substrate. In any event, due to the presence of the bumps on the semiconductor die, a gap is formed between the substrate and the active surface of the semiconductor die attached thereto. Since the substrate is not planar and since the solder bumps are not of uniform size, the height of the gap between the semiconductor die and the substrate will vary.

Typically, since the semiconductor die and the substrate have different coefficients of thermal expansion, have different operating temperatures and have different mechanical properties with differing attendant reactions to mechanical loading and stresses, the individual joints formed by the bumps between the semiconductor die and substrate are subject to different levels of loads thereby having different stress levels therein. Therefore, the bumps must be sufficiently robust to withstand such varying loads and stress levels to maintain the joint between the semiconductor die chip and the substrate for both electrical and mechanical connections therebetween. Additionally, the bumps must be sufficiently robust to withstand environmental attack thereto. To enhance the joint integrity formed by the bumps located between the semiconductor die and the substrate, an underfill material typically comprised of a suitable polymer is introduced in the gap between the semiconductor die and the substrate. The underfill material serves to distribute loads placed on the semiconductor die and substrate, transfers heat from the semiconductor die, provides a reduced corrosion environment between the substrate and semiconductor die and provides an additional mechanical bond between the semiconductor die and the substrate to help distribute loading and stress on the semiconductor die and bumps.

While the use of an underfill material between a semiconductor die and a substrate is recognized as an improvement from a reliability perspective, filling the gap between the semiconductor die and a substrate with underfill material poses problems from a manufacturing perspective. Among the problems is (1) the ability to uniformly fill the gap between the semiconductor die and the substrate with underfill material without voids and (2) the time required for filling the gap between the semiconductor die and the substrate with underfill material. In any event, if the gap between the semiconductor die and the substrate is not uniformly filled and voids occur therein, greater problems may occur than if no underfill material were used to fill the gap.

Currently, various methods are used to minimize the presence of any voids in the underfill material in the gap between the semiconductor die and a substrate. For example, one underfill method uses a one-sided or two-sided dispensing process where the underfill material is dispensed along only one side or two adjacent sides of the semiconductor die. The underfill material is allowed to freely flow and, with the action of capillary forces between the semiconductor die and substrate, pushing air existing in the gap between the die and the substrate from opposing sides of the semiconductor die as the underfill material fills the gap, thereby minimizing potential voids. Although this method is somewhat effective in minimizing voids in the underfill material in the gap between the semiconductor die and the substrate, the underfill method typically requires a relatively lengthy period of time for the underfill material to flow through the gap.

In an effort to decrease the period of time for the underfill process, U.S. Pat. No. 5,710,071 to Beddingfield et al. discloses a method of mounting a semiconductor die over an aperture in a substrate and dispensing the underfill material along the entire periphery of the semiconductor die. The underfill material flows through the gap between the semiconductor die and the substrate via capillary action toward the aperture in the substrate, thereby expelling air in the gap through the hole in the substrate to minimize voids in the underfill material.

Other methods for underfilling the gap between a semiconductor die and substrate to minimize voids in the underfill material include either injecting underfill material along one or two sides of the semiconductor die mounted on the substrate or injecting underfill material through an aperture centrally formed in the substrate below the semiconductor die, in each instance, the underfill material flowing by capillary action to fill the gap.

U.S. Pat. No. 5,766,982 to Akram et al., discloses a method of injecting underfill material along the sides of a semiconductor die mounted on a substrate and/or through an aperture in the substrate located below the semiconductor die mounted on a substrate utilizing capillary force to fill the gap between the semiconductor die and the substrate and further utilizing gravitational force to fill the gap by placing the substrate and semiconductor device on an inclined plane with or without a barrier at the lower side of the semiconductor die to prevent the underfill material from substantially flowing beyond the lower side of the semiconductor die.

Although such methods for filling the gap between a semiconductor die and a substrate with underfill material may be satisfactory, it is desirable to reduce the length of the period of time required for filling the gap. Therefore, it would be advantageous to develop a satisfactory method for filling the gap between a semiconductor die and a substrate with underfill material requiring a minimum length of time.

BRIEF SUMMARY OF THE INVENTION

The present invention relates to a method and apparatus for underfilling the gap between a bumped or raised semiconductor device and a substrate. The present invention is directed to a method and apparatus for filling the gap between a semiconductor die and a substrate using underfill material where the semiconductor die is electrically and mechanically connected to the substrate. The method and apparatus includes the use of a wetting agent on at least a portion of the surface of the semiconductor die forming a portion of the gap between the semiconductor die and a substrate to which it is mounted and/or a wetting agent on at least a portion of the substrate forming a portion of the gap to increase the surface tension between the underfill material and the surface of the semiconductor die and/or the substrate. One embodiment of the present invention includes a layer of silane as a wetting agent on at least a portion of the active surface of the semiconductor die and/or a layer of silane on at least a portion of the upper surface of the substrate to which the semiconductor die is mounted, each layer of silane increasing the surface tension thereon, the increased surface tension allowing the underfill material to fill the gap between the semiconductor die and the substrate via capillary action forces in a lesser length of time. Various wetting agents may be used according to the present invention, such as glycidoxypropyltrimethoxysilane and ethyltrimethoxysilane.

The silane layer may be applied to the semiconductor device and/or the substrate by a dispensing method, a brushing method, and/or a spraying method. Further, the silane layer may comprise at least one or more layers.

The method and apparatus of the present invention of the use of a wetting agent may be used when filling a gap between any type semiconductor device, bare or packaged, and a substrate when the semiconductor device is connected thereto.

BRIEF DESCRIPTION OF THE SEVERAL VIEWS OF THE DRAWINGS

The method and apparatus of the present invention will be more fully understood from the detailed description of the invention taken in conjunction with the drawings, wherein.

DETAILED DESCRIPTION OF THE INVENTION

Figure 1:
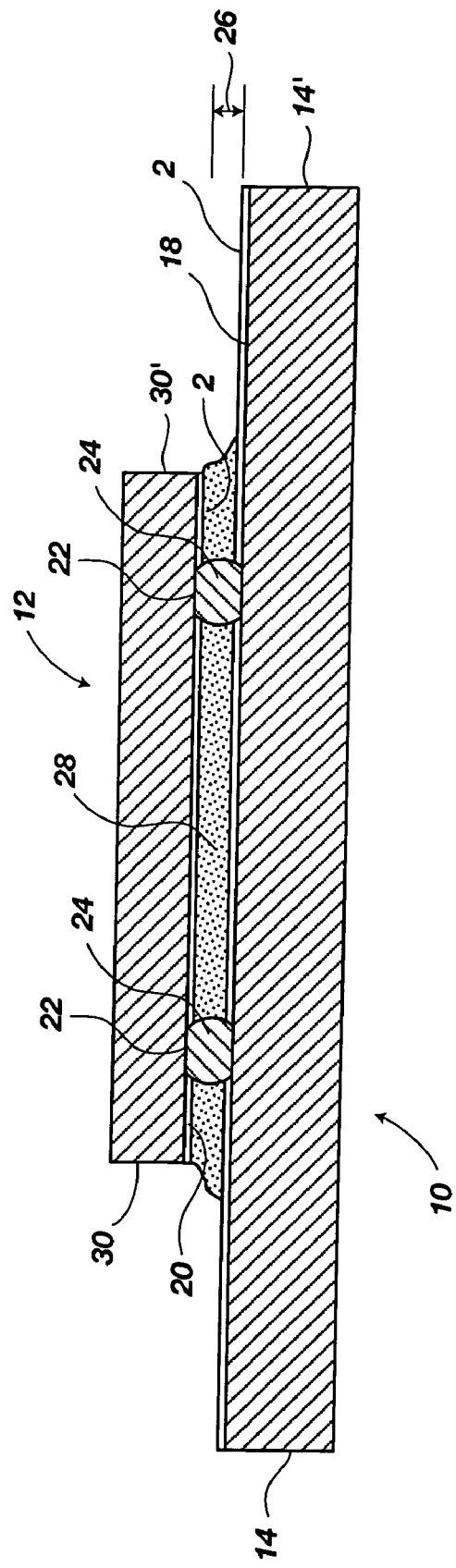
FIG. 1 is a cross-sectional view of a portion of a semiconductor die having a wetting agent layer thereon and attached to a portion of a substrate having a wetting agent layer thereon and having an underfill material in the gap between the semiconductor die and the substrate in accordance with the present invention.

Referring to drawing FIG. 1, a substrate or chip carrier 10 is shown for connecting to a semiconductor die, device or flip-chip 12 by conventional direct chip bonding techniques. Substrate 10 typically comprises various materials, such ceramic, silicone, glass, and combinations thereof. Substrate 10 preferably comprises a printed circuit board (PCB) or other carrier, which is used in semiconductor die technology, such as an FR4 PCB. Substrate 10 includes side walls 14, 14', side walls 16, 16' (see FIG. 4) and an upper surface 18, of which side walls 14 and 14' oppose each other and side walls 16 and 16' oppose each other (see FIG. 4), the upper surface 18 having circuits and/or contact pads located thereon.

Semiconductor die 12 includes a plurality of sides 30, 30', 32, 32' (see FIG. 4) and an active surface 20. The sides 30 and 30' of the semiconductor die 12 oppose each other while sides 32 and 32' oppose each other. The active surface 20 includes integrated circuitry and a plurality of bond pads 22. The bond pads 22 have bumps 24 thereon for providing both electrical connection and mechanical connection to the substrate 10.

An electrical assembly is produced by placing and securing the semiconductor die 12 on the upper surface 18 of substrate 10. Specifically, the bumps 24 of the bond pads 22 of the semiconductor die 12 are aligned with the circuits and/or contact pads located on upper surface 18 of substrate 10. The semiconductor die 12 is then electrically and mechanically connected to the substrate 10 by reflowing or curing the bumps 24 to the circuits and/or contact pads of upper surface 18 of substrate 10, depending upon the type of material comprising bumps 24. Alternatively, the bumps 24 may be formed on the circuits and/or substrate 10 prior to attachment of the semiconductor die 12 thereto. In other words, either the bond pad of the semiconductor die or the circuits and/or contact pads of the substrate 10 or both may include the bumps, such as bumps 24, thereon. Although bumps 24 are typically formed of various solder alloys, it is understood that any other materials known in the art (e.g., gold, indium, tin, lead, silver or alloys thereof) that reflow to make electrical interconnects to the circuits and/or contact pads of substrate 10 can also be used. Additionally, the bumps 24 may be formed of conductive polymeric and epoxy materials, may include various metals being contained therein, and may be plated with metals after formation, etc.

When the bumps 24 on the bond pads of the semiconductor die 12 are reflowed to electrically and mechanically connect the semiconductor die 12 to the circuits and/or contact pads of the substrate 10, a space or gap 26 is formed between the active surface 20 of semiconductor die 12 and the upper surface 18 of substrate 10, the size of the gap 26 generally being determined by the size of the reflowed solder bumps on the bond pads of the semiconductor die 12. Typically, such a gap will vary from approximately 3 mils to about 10 mils.

In the present invention, prior to connecting the semiconductor die 12 to the circuits and/or contact pads on the upper surface 18 of the substrate 10, a wetting agent layer 2, such as a silane layer 2, is formed on the top surface 18 of substrate 10 and/or the active surface 20 of the semiconductor die 12. The wetting agent layer 2, such as a silane layer 2, can be formed thereon by any suitable spray method, brush application method, and/or a dispense method, although spraying a silane layer 2 as a wetting agent layer is the preferable method in order to provide a substantial uniform layer thereon. The silane layer 2 is most preferably formed as a monolayer thickness but may be formed as one or more multiple layers or formed in addition to other layers promoting a wetting effect on the surface of either the upper surface 18 of the substrate 10, the active surface 20 of the semiconductor die 12, or both. The silane layer 2 may be provided to the surface of the semiconductor die 12 while in its wafer form prior to or after burn-in testing, or after the wafer has been diced into multiple individual dice or an individual die. As to the substrate 10, the silane layer 2 may be provided thereon at any stage prior to the semiconductor die 12 being mounted thereto. In addition, the silane layer 2 may be comprised of any silane-based material, i.e., glycidoxypropyltrimethoxysilane (b.p. 290° C.) and Ethyltrimethoxysilane (b.p. 310° C.), so long as any substantial degradation thereof during any solder reflow process or curing process of the bumps 24 or any substantial degradation thereof during any burn-in and/or testing process is minimal so that the silane layer 2 promotes a sufficient wetting effect on the active surface 20 of the semiconductor die 12, the upper surface 18 of the substrate 10, or both.

Once the semiconductor die 12 is mounted on the substrate 10 as previously set forth an underfill material 28 is applied to fill the gap 26 between the semiconductor die 12 and the substrate 10. As previously stated, the purpose of the underfill material 28 is to provide a reduced corrosion environment between the substrate 10 and semiconductor die 12, help provide an additional mechanical bond between the semiconductor die 12 and the substrate 10, to help distribute loading and stress on the semiconductor die 12 and bumps 24, and to help transfer heat from the semiconductor die 12. The underfill material 28 typically comprises a polymeric material, such as an epoxy or an acrylic resin, and may contain inert filler material therein. The underfill material 28 typically has a thermal coefficient of expansion that approximates that of the semiconductor die 12 and/or the substrate 10 to help minimize loading and stress placed on either the semiconductor die 12 or the substrate 10 during the operation of the semiconductor die 12 caused by the heating of the underfill material 28.

To promote filling of the gap 26 between the substrate 10 and semiconductor die 12, the viscosity of the underfill material 28 is controlled taking into account the flow characteristics of the underfill material 28, the material characteristics of the substrate 10, the material characteristics of the semiconductor die 12, and the size of the gap 26. By providing the silane layer 2 to the substrate 10 and the semiconductor die 12, the material characteristics of the surfaces thereof are changed so that the surface tension is increased. Accordingly, the underfilling of the gap 26 takes less time, allowing for a more efficient underfilling process.

For example, underfill flow time t is governed by the Washburn Law for one sided flow. The equation for calculating the amount of flow time under this law is generally known as follows:

$$t = \frac{3\mu l^2}{h\sigma\cos\theta}$$

where
   $\mu$ is the absolute viscosity of the underfill material;
   $l$ is the flow distance at time t;
   $h$ is the gap distance between the chip and substrate;
   $\sigma$ is the surface-tension coefficient of the underfill material; and
   $\theta$ is the wetting or contact angle.

Figure 2:
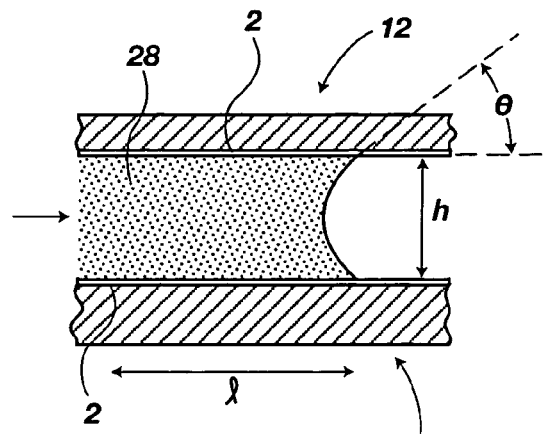
FIG. 2 is an enlarged cross-sectional view of a portion of a semiconductor die having a wetting agent layer thereon and a portion of a substrate having a wetting agent layer thereon illustrating a contact angle of the underfill material contacting a surface of the semiconductor die and a surface of the substrate in accordance with the present invention.

As shown in the above equation, manipulation of the contact angle $\theta$ can either decrease or increase the flow time t for filling the gap 26. As illustrated in drawing FIG. 2, the contact angle $\theta$ is the angle by which the underfill material 28 makes contact with the surface of the substrate 10 and the semiconductor die 12 via the constant capillary force driving the flow. The contact angle $\theta$ may be reduced by increasing the surface tension of the substrate 10 and semiconductor die 12, which results in a drop of flowing time. For example, according to the equation above, reducing the contact angle $\theta$ from 30° to 100 will reduce the flow time t for filling the gap 26 between the substrate and chip by 12%.

Thus, it can be appreciated that by pretreating the surfaces of the substrate 10, the semiconductor die 12, and/or both, with a silane layer 2, as previously set forth, a wetting effect to the surface thereof results in an increased surface tension. In this manner, the contact angle θ is reduced, resulting in a decrease in flow time t and a more efficient and cost-effective method for underfilling the semiconductor device.

Therefore, each of the embodiments hereinafter described include a silane layer to promote faster underfilling time via capillary action, although each embodiment may not explicitly discuss or illustrate the silane layer and the effects thereof on a semiconductor die, substrate, and/or both. Rather, the embodiments describe various methods for underfilling the gap between a semiconductor device and a substrate. Further, it should be stated that the present invention is not limited to the specific embodiments described below.

Figure 3:
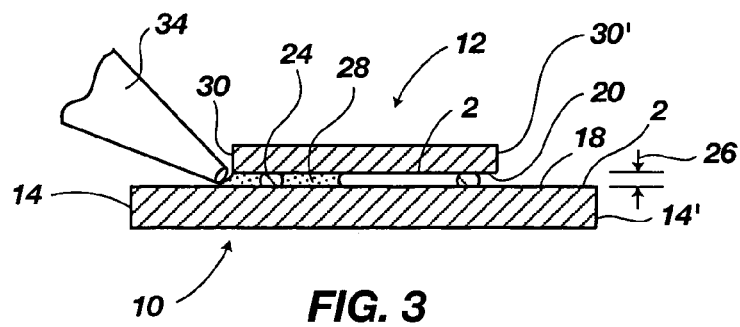
FIG. 3 is a cross-sectional view of a portion of a semiconductor die and a portion of a substrate of a first embodiment for dispensing underfill material between the semiconductor die and the substrate in accordance with the present invention.
Figure 4:
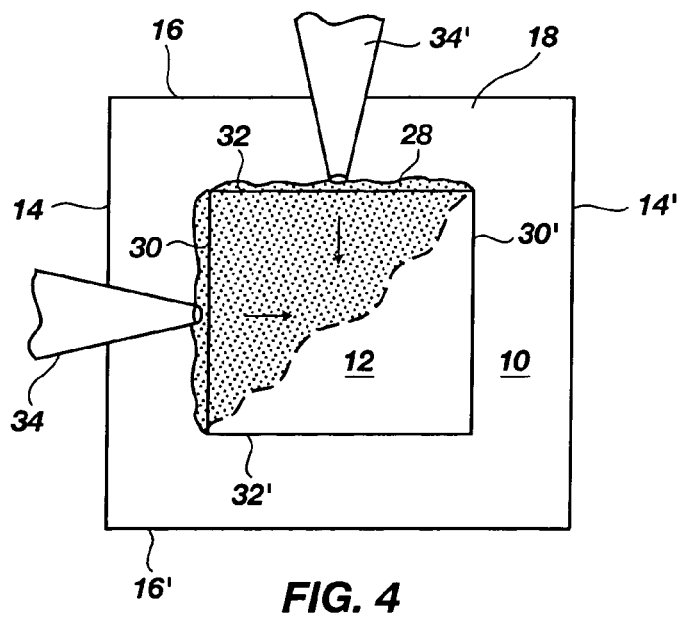
FIG. 4 is a top view of a semiconductor die and a substrate illustrating a first embodiment for dispensing underfill material between the semiconductor die and the substrate in accordance with the present invention.

As shown in drawing FIGS. 3 and 4, underfilling is accomplished by applying the underfill material 28 under either one or two of the adjacent side ends 30 and 32 of the semiconductor die 12. The underfill material 28 is then allowed to freely flow, as a result of capillary forces, between the semiconductor die 12 and the substrate 10, and exiting on the remaining sides. In using the one-sided or two-sided dispense method, the underfill material 28 is able to push any air which exists in a space between the die and the substrate out from the opposing side ends 30 and 32 of the semiconductor die as the material fills the space. The underfill material 28 is applied with an underfill dispenser 34, such as a syringe having a suitable nozzle thereon or any other dispensing means known in the art. After application of the underfill material 28, the material is cured either by heat, ultraviolet light, radiation, or other suitable means in order to form a solid mass.

Figure 5:
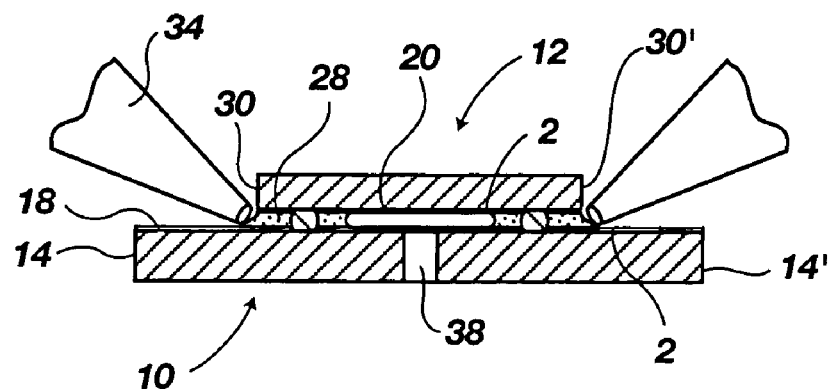
FIG. 5 is a cross-sectional view of a portion of a semiconductor die and a portion of a substrate illustrating a second embodiment for dispensing underfill material between the semiconductor die and the substrate and having an aperture therethrough in accordance with the present invention.
Figure 6:
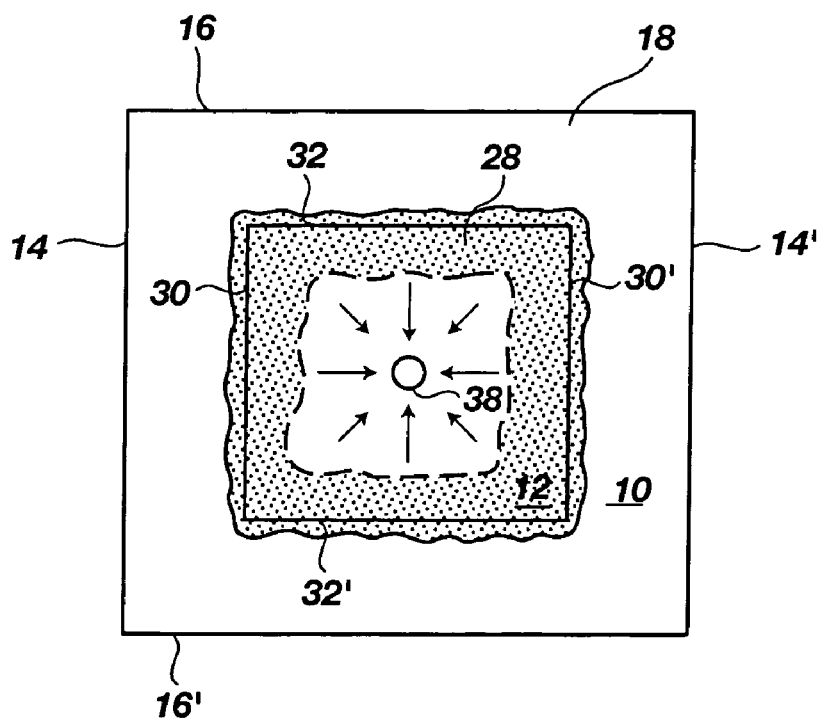
FIG. 6 is a top view of a semiconductor die and a substrate illustrating a second embodiment for dispensing underfill material between the semiconductor die and the substrate and having an aperture therethrough in accordance with the present invention.

In a second embodiment of the present invention, a through-hole 38 is formed in the substrate 10, which is made to be located substantially centrally under the semiconductor die 12. Underfilling may then be accomplished by applying the underfill material 28 around the entire perimeter of the die 12, as shown in drawing FIGS. 5 and 6. The underfill material 28 is then allowed to flow freely via the capillary forces as in the previous embodiment, however, the underfill material 28 exits through the through-hole 38, pushing any air which exists in the gap 26 between the die 12 and the substrate 10 through the through-hole 38 therein. The arrows in drawing FIG. 6 represent the directional flow of the underfill material 28 upon dispensing about the perimeter of the semiconductor die 12.

Figure 7:
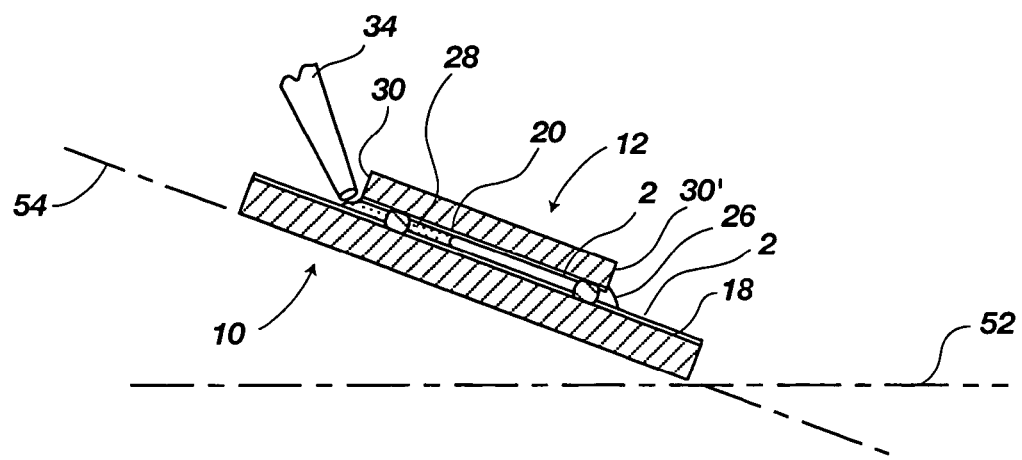
FIG. 7 is a cross-sectional view of a portion of a semiconductor die and a portion of a substrate illustrating a third embodiment for dispensing underfill material between the semiconductor die and the substrate, both located on an inclined plane, in accordance with the present invention.

In a third embodiment of the present invention as shown in drawing FIG. 7, the substrate 10 may be positioned on an inclined plane 54 with respect to a horizontal plane 52. The angle of elevation or inclination of the inclined plane 54 and the attendant substrate 10 and semiconductor die 12 is dependent on the viscosity or the rate of dispensing of the underfill material 28. The viscosity of the underfill material 28 should be adjusted to allow facile flow of the underfill material 28 but should be left low enough to readily prevent the flow of the underfill material 28 beyond the perimeter of the semiconductor die 12. It should also be understood that the substrate 10 may be inclined by placing the substrate 10 on a support member 44, such as a tilted table or conveyor belt, as is shown in drawing FIG. 9 and further described below. Alternately, the substrate 10 may be inclined by placing the substrate 10 below a support member or horizontal plane 52 as described hereinbelow.

Since the substrate 10 having the semiconductor die 12 thereon is placed on an incline, in addition to any fluid pressure used to inject the underfill material and any capillary action force acting on the underfill material, a gravitational force also acts on the underfill material causing the underfill material 28 to readily flow from side end 30 toward side end 30'. Due to the additional action of the gravitational force to that of the injection pressure and capillary action, air pockets, bubbles, and voids found within the underfill material 28 are displaced by the greater density underfill material 28 as it flows toward the side end 30' of semiconductor die 12. The ability to displace and the speed of displacement of the voids is dependent on the inclined angle of the substrate 10 having semiconductor die 12 thereon, the viscosity of the underfill material 28, the injection rate of the underfill material 28, and the uniformity of the injection of the underfill material 28 into the gap between the substrate 10 and the semiconductor die 12 to form a substantially uniform flow front of underfill material 28 into and through the gap 26. If desired, the process of underfilling the gap 26 may be repeated by inclining the substrate 10 in the opposite direction and subsequently dispensing another amount of underfill material 28 from an opposing side of the semiconductor die 12 into the gap 26 to improve the uniformity of the underfill material 28 filling the gap 26.

Figure 8:
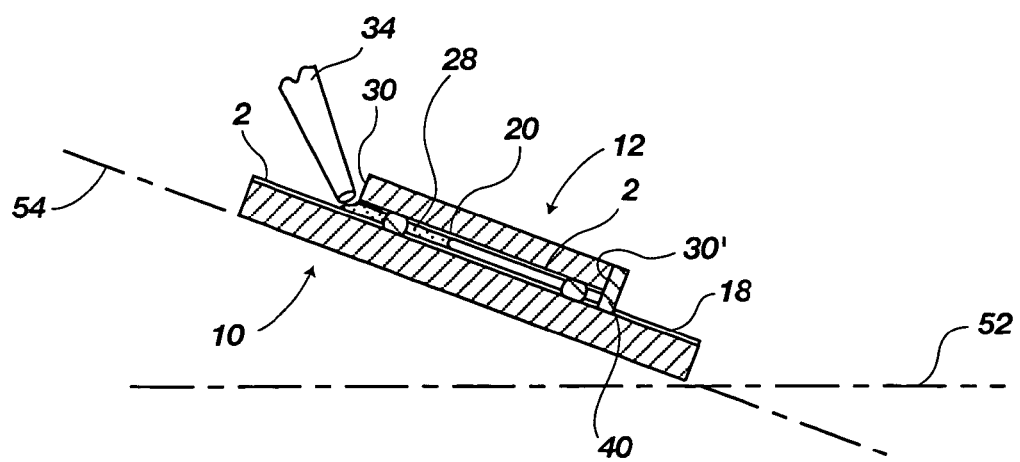
FIG. 8 is a cross-sectional view of a portion of a semiconductor die and a portion of a substrate illustrating a fourth embodiment for dispensing underfill material between the semiconductor die and the substrate, both located on an inclined plane, having a barrier located adjacent a lower side of the semiconductor die, in accordance with the present invention.

Referring now to drawing FIG. 8, a fourth embodiment of an interconnected semiconductor die 12 and substrate 10 is shown. As shown, a dam or barrier 40 is used on the upper surface 18 of the substrate 10 to help contain the flow of the underfill from the gap at the side end 30' of the semiconductor die 12. Conventional molding equipment and techniques (e.g., pour molding, injection molding, adhesive bonding, etc.) can be used to form the dam 40 on the substrate 10. The dam 40 is typically formed from any suitable epoxy resin material compatible with the substrate 10.

The dam 40 extends upwards from, and is substantially perpendicular to, the upper surface 18 of the substrate 10. As shown, the dam 40 may be seen to lay substantially parallel and slightly aft the side end 30' of the semiconductor die 12.

The dam 40 limits the expansion or gravitational flow of the underfill material 28 beyond the position of the dam 40. During the underfill procedure, the underfill material 28 coats and spreads out onto the surfaces of the semiconductor die 12 and substrate 10. The dam 40 prevents the spread of underfill material 28 beyond the side end 30' of the semiconductor die 12 by means of surface tension.

Additionally, use of the dam 40 (as opposed to using no dam) permits use of lower viscosity underfill materials, if so desired, during the underfilling procedure. The underfill material 28 may be easily controlled and a wider range of viscosities may be used by controlling the depth of the dam 40 and by controlling the width between the side end 30' of the semiconductor die 12 and the dam 40. Use of the dam 40 also permits tilting the substrate 10 at a greater angle of elevation with respect to the horizontal plane 52 in order to accelerate the underfill process or to permit the use of higher viscosity underfill materials should such a need arise. Furthermore, if desired, a dam 40 may be used on all three sides of the semiconductor die 12 located on the substrate 10 except the side of the semiconductor die 12 from which the underfill material 28 is being dispensed.

Figure 9:
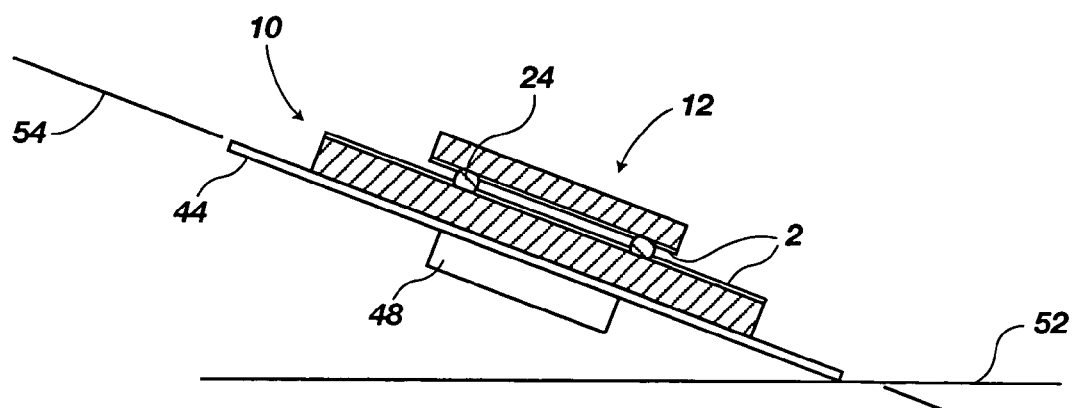
FIG. 9 is a cross-sectional view of a portion of a semiconductor die and a portion of a substrate illustrating a fifth embodiment for dispensing underfill material having a vibrator attached to the substrate in accordance with the present invention.

Referring to drawing FIG. 9, a side view of a semiconductor die 12 and substrate 10, interconnected via bumps 24, of a fifth embodiment of the invention is shown. The substrate 10 is inclined with respect to a horizontal plane 52 by placing the substrate 10 onto a support member 44. Support member 44 can be a tilt table, a tilted conveyor belt, or any other means of support suitable for holding the substrate 10 of the present invention. Preferably, support member 44 can be positioned and locked at various angles and can also be elevated or lowered from front to back as well as side to side.

Attached to the support member 44 is a vibrator 48. The vibrator 48 facilitates and hastens the displacement of air pockets and voids by the underfill material 28 during the previously described underfill process. The action of the vibrator 48 also permits the use of higher viscosity underfill materials and/or permits underfilling with the support member 44 positioned at a gradual slope.

Figure 10:
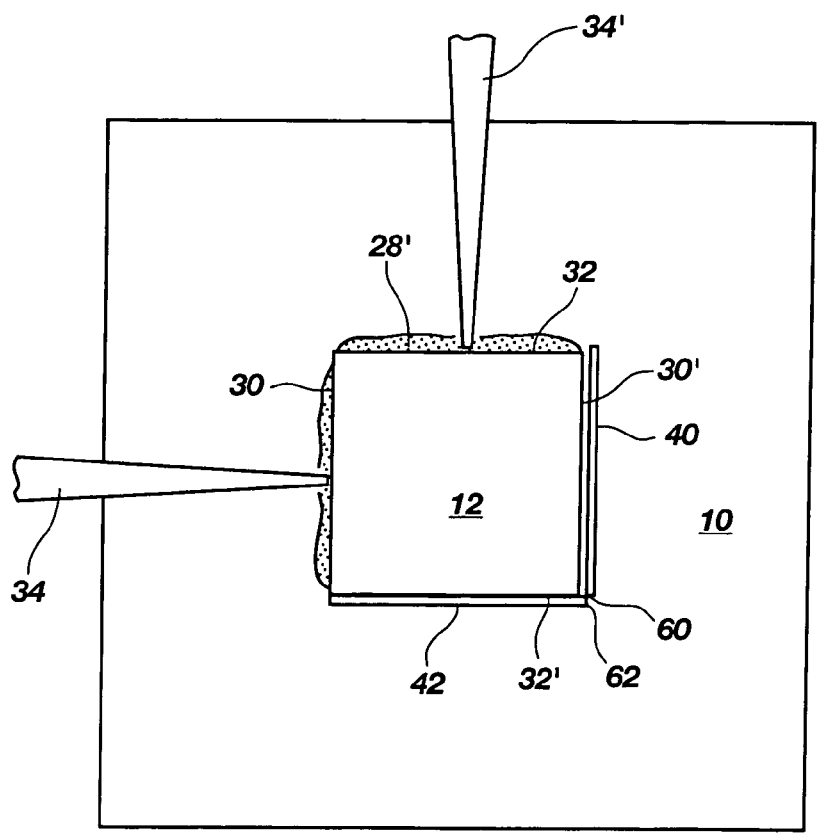
FIG. 10 is a top view of a semiconductor die and a substrate illustrating a sixth embodiment for dispensing underfill material between the semiconductor die and the substrate, both located on an inclined plane, the substrate having two barriers located adjacent two sides of the semiconductor die, in accordance with the present invention.

Referring to drawing FIG. 10, a top view of an interconnected, solder-bumped semiconductor die 12 and substrate 10 of a sixth embodiment of the present invention is shown similar to that of the second embodiment as shown in drawing FIG. 8. However, this particular embodiment illustrates the use of two dams 40 and 42, which are oriented transversely with respect to one another. The two dams 40 and 42 lie in substantially parallel orientation with respect to two mutually perpendicular and abutting side ends 30' and 32' of the semiconductor die 12.

The method of this embodiment permits underfilling along two side ends 30 and 32 simultaneously. Dams 40 and 42 prevent the spread and overflow of underfill material 28 beyond side ends 30' and 32' of the semiconductor die 12. The underfill material may be easily controlled and a wider range of viscosities may be used by controlling the depth of the dams 40 and 42, by controlling the width between the side ends 30' and 32' of the semiconductor die 12 and the dams 40 and 42, and by controlling the distance between the edges 60 and 62 of the dams 40 and 42.

An alternative method comprises tilting the substrate 10 so as to elevate side end 32 and applying the underfill material 28 under side end 32 via the underfill dispenser 34'. The substrate 10 is then tilted so as to elevate side end 30 and the underfill material 28 is dispensed along side end 30 via underfill dispenser 34. This alternating underfill technique can be repeated until the underfill material 28 is free of air pockets and voids.

Figure 11:
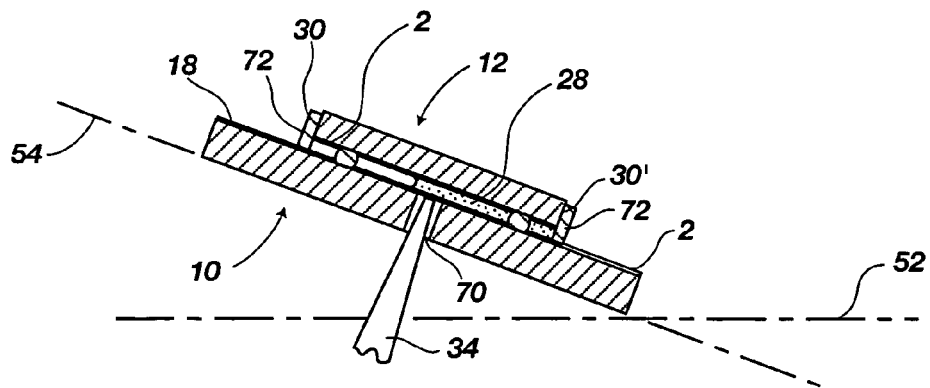
FIG. 11 is a cross-sectional view of a portion of a semiconductor die and a portion of a substrate illustrating a seventh embodiment for dispensing underfill material between the die and the substrate having an aperture therethrough and barriers located adjacent lower sides of the semiconductor die, both the semiconductor die and the substrate located on an inclined plane, the underfill material dispensed through the aperture in the substrate in accordance with the present invention.

Referring to drawing FIG. 11, a cross-sectional view of an interconnected, solder-bumped semiconductor die 12 and substrate 10 of a seventh embodiment of the present invention is shown midway through the underfill process. In this particular embodiment, the substrate 10 has a suitable shaped opening 70 situated near the center of the substrate 10 through which underfill material 28 can be applied via the underfill dispenser 34. Additionally, dams 72 located on each side of the semiconductor die 12 are molded or suitably attached to upper surface 18 of the substrate 10 as described hereinbefore being positioned to lay slightly beyond each of the side ends 30, 30' and 32, 32', respectively. It should also be understood that other dams 72' (not shown) are located laterally on the side ends 32 and 32' of the semiconductor die 12 to confine the underfill.

Figure 12:
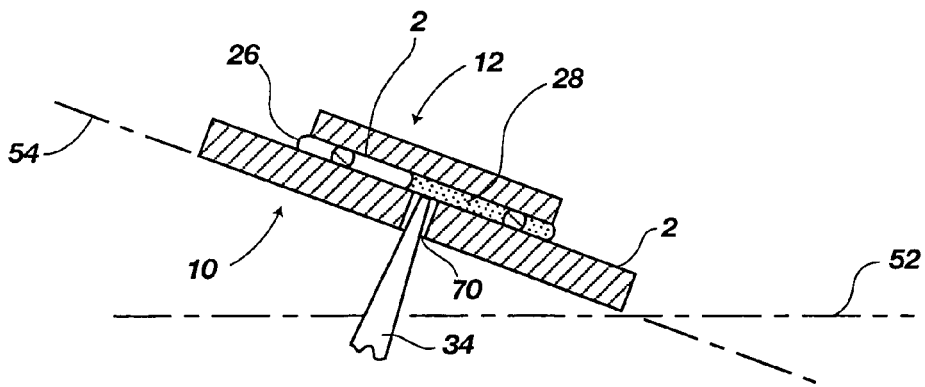
FIG. 12 is a cross-sectional view of a portion of a semiconductor die and a portion of a substrate having an aperture therethrough illustrating an eighth embodiment for dispensing underfill material between the semiconductor die and the substrate, both the semiconductor die and the substrate located on an inclined plane, the underfill material dispensed through the aperture in the substrate, without utilizing barriers, in accordance with the present invention.

Referring to drawing FIG. 12, a cross-sectional view of an interconnected, solder-bumped semiconductor die 12 and substrate 10 of an eighth embodiment of the present invention is shown midway through the underfill process. In this particular embodiment, the substrate 10 has a suitable shaped opening 70 situated near the center of the substrate 10 through which underfill material 28 can be applied via the underfill dispenser 34. In this instance, there is no dam used to confine the underfill material 28. Additionally, if desired, the substrate 10 having semiconductor die 12 located thereon may be tilted in each direction to enhance the flow of the underfill material 28 in the gap 26 between the substrate 10 and the semiconductor die 12 during the underfilling process.

Figure 13:
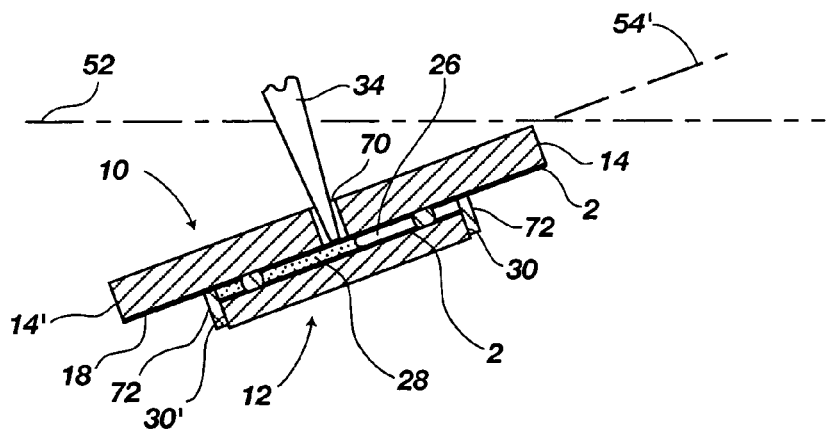
FIG. 13 is a cross-sectional view of a portion of a semiconductor die and a portion of a substrate having an aperture therethrough, illustrating a ninth embodiment for dispensing underfill material between the semiconductor die and the substrate, both the semiconductor die and the substrate located on an inclined plane, the underfill material dispensed through the aperture in the substrate and utilizing barriers on some of the sides of the semiconductor die, wherein the semiconductor die and the substrate are inverted in accordance with the present invention.

Referring to drawing FIG. 13, a cross-sectional view of an interconnected, solder-bumped semiconductor die 12 and substrate 10 of a ninth embodiment of the present invention is shown midway through the underfill process. In this particular embodiment, the substrate 10 has a suitable shaped opening 70 situated near the center of the substrate 10 through which underfill material 28 can be applied via the underfill dispenser 34. Additionally, dams 72 located on each side of the semiconductor die 12 are molded or suitably attached to upper surface 18 of the substrate 10 as described hereinbefore being positioned to lay slightly beyond each of the side ends 30, 30' and 32, 32', respectively. It should also be understood that other dams 72' (not shown) are located laterally on the side ends 32 and 32' of the semiconductor die 12 to confine the underfill material 28. In this instance, the substrate 10 having semiconductor die 12 located thereon is inverted during the underfill process so that the underfill material 28 is dispensed through the opening 70 into the gap 26 between the substrate 10 and semiconductor die 12. As in the previous embodiments, the substrate 10 is located at an inclined plane 54' with respect to horizontal plane 52 although located therebelow and inclined with respect thereto.

In operation, the present method is initiated by elevating or inclining side wall 14 of the substrate 10. As the underfill material 28 is added, in this case by means of an opening 70 through the substrate 10, the underfill material 28 flows towards the dam 72 and fills the lowered portion of the gap 26 between the semiconductor die 12 and the substrate 10. The side wall 14 of the substrate 10 is then lowered and the side wall 14' of the substrate 10 is elevated. The backfill method is then repeated with the underfill material 28 now flowing towards the opposing dam 72 to complete the filling of the gap 26 between the semiconductor die 12 and the substrate 10. The underfill material 28 is then cured as previously described. Alternately, the underfill material 28 may be cured after the partial filling of the gap 26 between the substrate 10 and semiconductor die 12, the remainder of the gap filled and subsequently cured.

Figure 14:
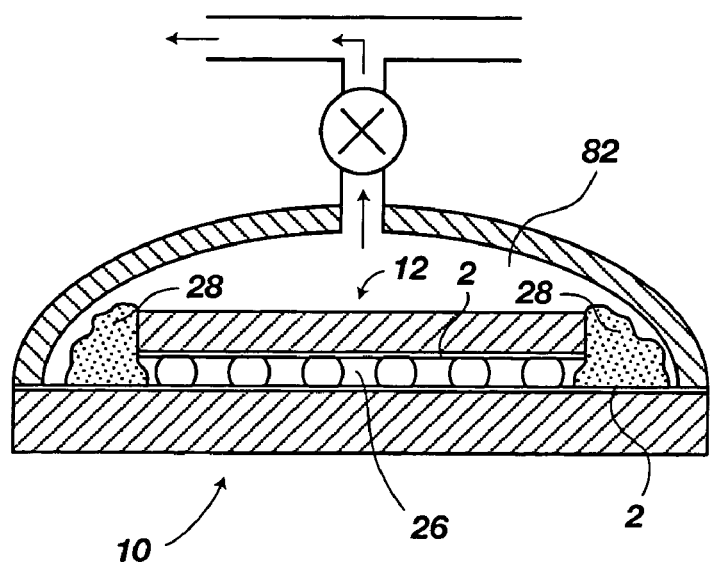
FIG. 14 is a cross-sectional view of a semiconductor die and a substrate illustrating a tenth embodiment for dispensing underfill material between the semiconductor die and the substrate, both the semiconductor die and the substrate located within a vacuum chamber, the air in the chamber being removed therefrom in accordance with the present invention.
Figure 15:
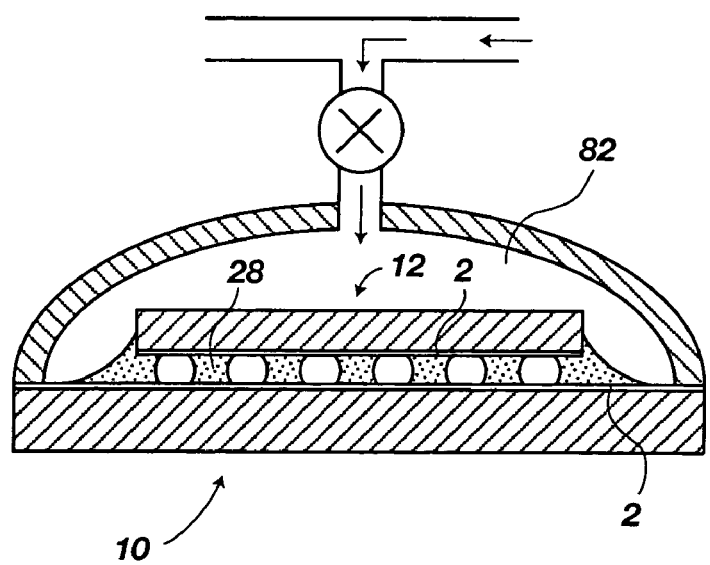
FIG. 15 is a cross-sectional view of a semiconductor die and a substrate illustrating another view of the tenth embodiment for dispensing underfill material between the semiconductor die and the substrate within a vacuum chamber, having air allowed to return to the evacuated chamber in accordance with the present invention.

Referring to drawing FIGS. 14 and 15, a cross-section view of an interconnected, solder bumped semiconductor die 12 and substrate 10 of a tenth embodiment is shown in an underfill process that includes a vacuum chamber 82 to underfill the gap 26 therebetween. In particular, a bead of underfill material 28 is provided on the substrate 10 about the periphery of the semiconductor die 12 by injection or any suitable method. Next, the semiconductor die 12 and substrate 10 are placed in the vacuum chamber 82 with a vacuum being subsequently applied to the semiconductor die 12 and the substrate 10 to evacuate the gap 26 therebetween. Air is then slowly allowed to re-enter the vacuum chamber 82 to force the underfill material 28 into the gap 26 (in addition to the force due to capillary action acting thereon) between the semiconductor die 12 and the substrate 10.

Hereinbefore, various embodiments of methods and apparatus for pretreatment of at least a portion of a surface of a semiconductor die and at least a portion of a surface of a substrate before the filling of the gap between the surface of a semiconductor die and a substrate using underfill material of the present invention has been described in relation to the appended drawings. However, the various embodiments are merely exemplary of the present invention, and thus, the specific features described herein are merely used to more easily describe such embodiments and to provide an overall understanding of the present invention. Accordingly, one skilled in the art will readily recognize that the present invention is not limited to the specific embodiments described herein.

As such, while the present invention has been described in terms of certain methods and embodiments, it is not so limited, and those of ordinary skill in the art will readily recognize and appreciate that many additions, deletions and modifications to the embodiments described herein may be made without departing from the scope of the invention as hereinafter claimed. For instance, the use of a wetting agent can be used to enhance the flow of any type of material to fill a gap located between any substrate and any type of semiconductor device, whether a bare die type device or a packaged semiconductor device, attached thereto by any manner, such as by use of an adhesively coated tape. In the instance of a packaged semiconductor device, the wetting agent would be applied after packaging.

What is claimed is:

1. A method for applying a material between a semiconductor device having a surface and a substrate having a surface, said method comprising:
   applying a liquid wetting agent layer to one of said surface of said semiconductor device and said surface of said substrate; and
   applying a flowable underfill material between the substrate and the semiconductor device, such that said flowable material contacts said liquid wetting agent layer.

2. The method according to claim 1, wherein said semiconductor device is attached to said substrate.

3. The method of claim 1, wherein said liquid wetting agent layer includes a layer of silane-based material.

4. The method according to claim 1, wherein said applying said liquid wetting agent layer comprises any one of a dispensing method, a brushing method, and a spraying method.

5. The method according to claim 1, wherein said liquid wetting agent layer comprises at least one layer.

6. The method according to claim 1, wherein said liquid wetting agent layer comprises a plurality of layers.

7. The method according to claim 1, wherein said liquid wetting agent layer comprises one of glycidoxypropyltrimethoxysilane and ethyltrimethoxysilane.

8. The method according to claim 1, wherein said applying a liquid wetting agent layer comprises providing a material that to the surface of one of said surface of said semiconductor device and said surface of said substrate for the application of an underfill material.

9. A method for applying a material between a semiconductor device and a substrate, said method comprising:
   providing a semiconductor device having an active surface, another surface, a first end, a second end, a first lateral side, and a second lateral side, said first end, said second end, said first lateral side, and said second lateral side forming at least a portion of a periphery of said semiconductor device;
   providing a substrate having an upper surface, a first side wall, a second side wall, a first lateral side wall and a second lateral side wall;
   applying a liquid wetting agent layer to one of said active surface of said semiconductor device and said upper surface of said substrate; and
   applying a flowable underfill material between said semiconductor device and said substrate, such that said flowable material contacts said applied liquid wetting agent layer.

10. The method according to claim 9, wherein said flowable material is applied substantially adjacent to at least one end of said semiconductor device.

11. The method according to claim 9, wherein said flowable material substantially fills a gap between said semiconductor device and said substrate.

12. The method according to claim 9, wherein said substrate includes an aperture extending through said substrate.

13. The method according to claim 12, wherein said aperture is located adjacent to said another surface of said semiconductor device.

14. The method according to claim 9, wherein said flowable material is provided substantially adjacent to said at least a portion of the periphery of said semiconductor device to fill a gap between said substrate and said semiconductor device.

15. The method according to claim 9, further comprising:
   elevating at least said first side wall of said substrate and said first end of said semiconductor device.

16. The method according to claim 15, wherein said elevating said first side wall of said substrate comprises placing said substrate on a support structure and elevating at least one portion of said support structure.

17. The method according to claim 15, further comprising:
   providing a dam on the substrate adjacent to at least one of said first end, said second end, said first lateral side and said second lateral side of said semiconductor device.

18. The method according to claim 17, wherein said dam extends to substantially between said semiconductor device and said substrate.

19. The method of claim 9, further comprising:
   vibrating one of said semiconductor device and said substrate.

20. The method according to claim 19, wherein said vibrating one of said semiconductor device and said substrate comprises placing said substrate on a support structure and vibrating said support structure.

21. The method according to claim 9, wherein said applying said flowable material comprises:
   providing said flowable material substantially adjacent said first end of said semiconductor device for filling between said substrate and said semiconductor device by one or more forces acting upon said flowable material.

22. The method according to claim 9, wherein said substrate includes at least one aperture extending through said substrate and substantially located adjacent to said another surface of said semiconductor device.

23. The method according to claim 22, wherein said flowable material is provided through said at least one aperture of said substrate substantially filling a gap between said substrate and said semiconductor device.

24. The method according to claim 17, wherein said applying said flowable material comprises:
   providing said flowable material substantially adjacent to said first end of said semiconductor device for filling a gap between said substrate and said semiconductor device.

25. The method according to claim 17, wherein said applying said flowable material comprises:
   providing said flowable material substantially adjacent to said first end and one of said first lateral side and said second lateral side of said semiconductor device for filling a gap between said substrate and said semiconductor device.

26. The method according to claim 17, wherein said substrate includes at least one aperture extending therethrough and substantially located adjacent to said another surface of said semiconductor device.

27. The method according to claim 26, wherein said flowable material is provided through said at least one aperture.

28. The method according to claim 27, wherein said flowable material is provided from below said substrate.

29. The method according to claim 27, wherein said flowable material is provided through said at least one aperture contacting at least a portion of said another surface of said semiconductor device.

30. The method according to claim 9, wherein said applying said flowable material between said semiconductor device and said substrate further comprises placing said semiconductor device and said substrate in a chamber, said chamber having an atmosphere therein having a variable pressure.

31. The method according to claim 30, further comprising: varying the pressure of said atmosphere in said chamber for said flowable material substantially filling a gap between said semiconductor device and said substrate.

32. A method for attaching a semiconductor assembly, said method comprising:
    providing a semiconductor device having an active surface;
    providing a substrate having an upper surface;
    applying a liquid wetting agent layer to one of said active surface of said semiconductor device and said upper surface of said substrate;
    connecting said semiconductor device to said substrate so that said active surface of said semiconductor device faces said upper surface of said substrate; and
    applying a flowable underfill material between the substrate and the semiconductor device, such that said flowable underfill material contacts said applied wetting agent layer.

33. The method according to claim 32, wherein applying said wetting agent layer comprises any one of a dispensing method, a brushing method, and a spraying method.

34. The method according to claim 32, wherein said wetting agent layer comprises at least one layer.

35. The method according to claim 32, wherein said wetting agent layer comprises a silane-based material.

36. A method for attaching a semiconductor assembly, said method comprising:
    providing a semiconductor device having an active surface, a first end, a second end, a first lateral side end and a second lateral side end;
    providing a substrate having an upper surface, a first side wall, a second side wall, a first lateral side wall and a second lateral side wall;
    applying a silane-based material layer to one of a portion of said active surface of said semiconductor device and a portion of said upper surface of said substrate;
    connecting said semiconductor device to said substrate so that said active surface of said semiconductor device faces said upper surface of said substrate; and
    applying a flowable underfill material between said semiconductor device and said substrate, such that said flowable underfill material contacts said applied silane-based material layer.

37. The method according to claim 35, wherein said wetting agent layer comprises one of glycidoxypropyltrimethoxysilane and ethyltrimethoxysilane.

38. A method for applying a material between a semiconductor device having a surface and a substrate having a surface, said semiconductor device mounted on said substrate, said method comprising:
    applying a essentially uniform liquid silane-based wetting agent layer having a total thickness of about a monolayer to at least one of said surface of said semiconductor device and said surface of said substrate; and
    applying a flowable underfill material between the substrate and the semiconductor device separately from said liquid silane-based wetting agent layer, such that said flowable material contacts said wetting agent layer.

* * * * *